US012631305B2

(12) United States Patent
Shibusawa et al.

(10) Patent No.: US 12,631,305 B2
(45) Date of Patent: May 19, 2026

(54) LIGHT EMITTING DEVICE, METHOD FOR MANUFACTURING LIGHT EMITTING DEVICE, LIGHT SOURCE DEVICE, AND LAMP

(71) Applicant: STANLEY ELECTRIC CO., LTD., Tokyo (JP)

(72) Inventors: Soichi Shibusawa, Tokyo (JP); Daizo Kambara, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 381 days.

(21) Appl. No.: 18/277,080

(22) PCT Filed: Jan. 28, 2022

(86) PCT No.: PCT/JP2022/003406
§ 371 (c)(1),
(2) Date: Aug. 14, 2023

(87) PCT Pub. No.: WO2022/176574
PCT Pub. Date: Aug. 25, 2022

(65) Prior Publication Data
US 2024/0125443 A1     Apr. 18, 2024

(30) Foreign Application Priority Data
Feb. 16, 2021     (JP) ................................. 2021-022566

(51) Int. Cl.
*F21S 41/143*          (2018.01)
*F21S 41/19*           (2018.01)
(Continued)

(52) U.S. Cl.
CPC ........... *F21S 41/143* (2018.01); *F21S 41/192* (2018.01); *H10H 20/855* (2025.01); *H10W 90/00* (2026.01)

(58) Field of Classification Search
CPC ........ F21S 41/143; F21S 41/192; F21S 43/14; F21S 43/195; H01L 25/0753;
(Continued)

(56) References Cited

U.S. PATENT DOCUMENTS 9,172,013 B2    10/2015  Ukawa
9,634,213 B2     4/2017  Ukawa
(Continued)

FOREIGN PATENT DOCUMENTS

CN      101494259 A    7/2009
JP      S61001066 A    1/1986
(Continued)

OTHER PUBLICATIONS

Japanese Office Action (and an English language translation thereof) dated Dec. 24, 2024, issued in counterpart Japanese Application No. 2021-022566.

(Continued)

*Primary Examiner* — Mohammad A Rahman
(74) *Attorney, Agent, or Firm* — Holtz, Holtz & Volek PC

(57) ABSTRACT

Semiconductor light emitting elements are configured to be mounted on the substrate, a frame is configured to be vertically provided on the substrate in an annular or oval-annular shape so as to surround the semiconductor light emitting elements, and a sealing portion is configured to seal an inner wall of the frame, an upper surface of the substrate inside the frame, and the semiconductor light emitting elements. The sealing portion includes a first resin portion configured to have a concave surface having at least one rotational plane having a central axis of the frame as a rotational axis, and a second resin portion configured to cover the concave surface of the first resin portion and having a convex external surface, and the sealing portion has an external surface in which an external surface of the first (Continued)

resin portion and an external surface of the second resin portion are integrated.

10 Claims, 7 Drawing Sheets

(51) Int. Cl.
   *H10H 20/855* (2025.01)
   *H10W 90/00* (2026.01)
(58) Field of Classification Search
   CPC ............. H10H 20/855; H10H 20/0362; H10H 20/857; H10H 20/853
   See application file for complete search history.

(56) References Cited

U.S. PATENT DOCUMENTS

| | | | |
|---|---|---|---|
| 10,153,415 B2 | 12/2018 | Ukawa | |
| 10,862,012 B2 | 12/2020 | Takeichi | |
| 11,552,227 B2 | 1/2023 | Takeichi | |
| 2015/0023016 A1 | 1/2015 | Ishihara et al. | |
| 2016/0020369 A1* | 1/2016 | Ukawa ................. | H10H 20/855 |
| | | | 29/841 |
| 2016/0290587 A1 | 10/2016 | Nakagawa et al. | |
| 2017/0236982 A1* | 8/2017 | Akiyama ............. | H10H 20/853 |
| | | | 315/185 R |
| 2019/0267518 A1 | 8/2019 | Hino et al. | |

FOREIGN PATENT DOCUMENTS

| | | | |
|---|---|---|---|
| JP | 2000156528 A | 6/2000 |
| JP | 2003234008 A | 8/2003 |
| JP | 2003234511 A | 8/2003 |
| JP | 2007180339 A | 7/2007 |
| JP | 2007242246 A | 9/2007 |
| JP | 2011228408 A | 11/2011 |
| JP | 2014209602 A | 11/2014 |
| JP | 2015015404 A | 1/2015 |
| JP | 2015023219 A | 2/2015 |
| JP | 2016195099 A | 11/2016 |
| JP | 2017059795 A | 3/2017 |
| JP | 2019106259 A | 6/2019 |
| JP | 2019149282 A | 9/2019 |
| JP | 2019192778 A | 10/2019 |

OTHER PUBLICATIONS

International Search Report (ISR) (and English translation thereof) dated Apr. 19, 2022, issued in International Application No. PCT/JP2022/003406.
Written Opinion dated Apr. 19, 2022, issued in International Application No. PCT/JP2022/003406.
Extended European Search Report (EESR) dated Aug. 5, 2024, issued in counterpart European Application No. 22755897.0.

* cited by examiner

STEP1

STEP2

STEP3

STEP4

STEP5

LIGHT EMITTING DEVICE, METHOD FOR MANUFACTURING LIGHT EMITTING DEVICE, LIGHT SOURCE DEVICE, AND LAMP

TECHNICAL FIELD

The present invention relates to a light emitting device, a method for manufacturing the light emitting device, a light source device, and a lamp.

BACKGROUND ART

In a related art, a light source unit used in, for example, a vehicular lamp provided with light emitting elements and a lens is known.

For example, Patent Literature 1 discloses a light source unit including a light emitting module that is disposed in a socket housing, a sealing portion that seals light emitting elements and a conductive portion on a substrate, and a lens portion that is formed by curing a molding resin on the sealing portion.

Further, Patent Literature 2 discloses a vehicular lighting device equipped with a frame portion that is provided on a substrate to surround light emitting elements, an optical element, and a sealing portion including an inner wall of the frame portion, the optical element, and a resin supplied to a space surrounded by the substrate.

Further, Patent Literature 3 discloses a vehicular lighting device equipped with light emitting elements provided on a substrate, a frame portion surrounding the light emitting elements, a sealing portion that is provided inside the frame portion to cover the light emitting elements, and an optical element provided on the sealing portion.

CITATION LIST

Patent Literatures

Patent Literature 1: Japanese Patent Application Laid-Open No. 2016-195099
Patent Literature 2: Japanese Patent Application Laid-Open No. 2019-106259
Patent Literature 3: Japanese Patent Application Laid-Open No. 2019-149282

SUMMARY OF INVENTION

Technical Problem

However, in a case where a lens is molded by injection of a resin, there is a problem that a positional deviation of the lens with respect to a light emitting element occurs due to a deviation during molding, and a desired light distribution cannot be obtained.

In addition, in a related art, there is a problem of adhesion such that peeling occurs due to a difference in the thermal expansion coefficient between a sealing resin and the lens.

The present invention has been made in view of the above-described points, and the object thereof is to provide a light emitting device, a method for manufacturing the light emitting device, a light source device, and a lamp, which suppress the positional deviation and the optical axis deviation between a light emitting element and an optical element, have high-precision light distribution characteristics, have high adhesion of a sealing portion and a lens even in temperature change, and have high precision and long life.

Solution to Problem

A light emitting device according to a first embodiment of the present invention includes
a substrate configured to have a circuit wiring,
semiconductor light emitting elements configured to be mounted on the substrate,
a frame configured to be vertically provided on the substrate in an annular or oval-annular shape so as to surround the semiconductor light emitting element, and
a sealing portion configured to seal an inner wall of the frame, an upper surface of the substrate inside the frame, and the semiconductor light emitting elements, in which
the sealing portion includes
a first resin portion configured to have a concave surface having at least one rotational plane having a central axis of the frame as a rotational axis, and
a second resin portion configured to cover the concave surface of the first resin portion and having a convex external surface, and
the sealing portion has an external surface in which an external surface of the first resin portion and an external surface of the second resin portion are integrated.

DESCRIPTION OF EMBODIMENTS

Figure 1A:
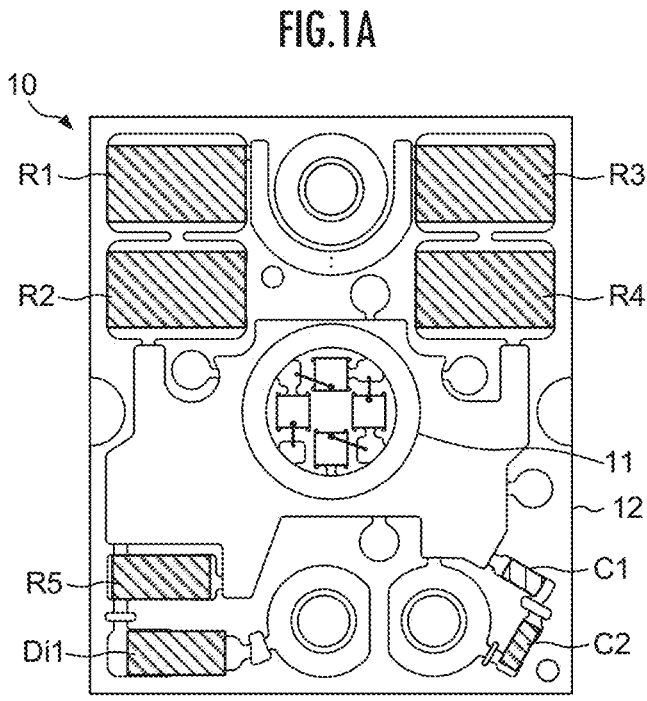
FIG. 1A is a plan view schematically illustrating an upper surface of a light source device 10 according to a first embodiment.

Hereinafter, preferred examples of the present invention will be described, but these examples may be appropriately modified and combined. In addition, in the following description and the accompanying drawings, substantially the same or equivalent parts will be described with the same reference numerals.

First Embodiment

Figure 1B:
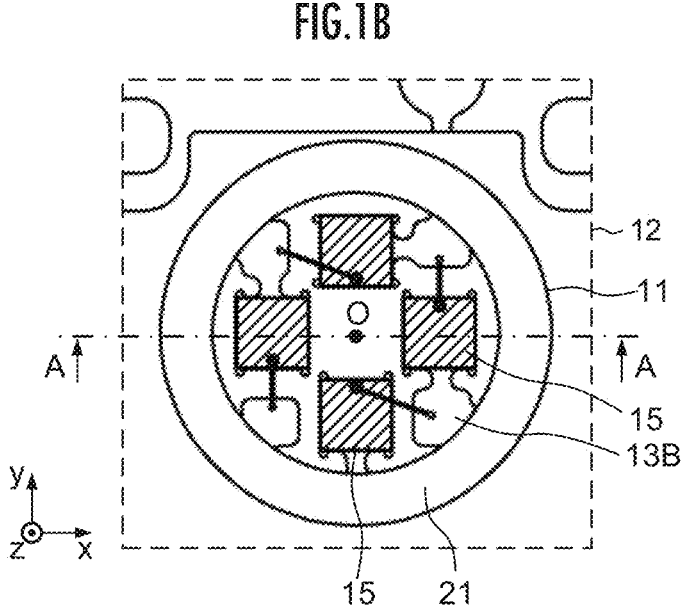
FIG. 1B is a top view schematically illustrating an internal structure of a light emitting device 11 provided in the light source device 10.
Figure 1C:
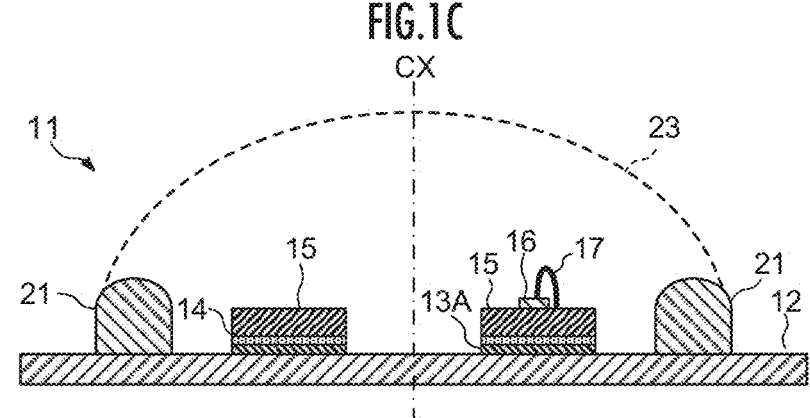
FIG. 1C is a cross-sectional view schematically illustrating a cross section of the light emitting device 11 taken along the line A-A of FIG. 1B.

FIG. 1A is a plan view schematically illustrating the upper surface of a light source device 10 according to a first embodiment of the present invention. FIG. 1B is a top view schematically illustrating the internal structure of a light emitting device 11 provided in the light source device 10. FIG. 1C is a cross-sectional view schematically illustrating a cross section of the light emitting device 11 taken along the line A-A of FIG. 1B.

As illustrated in FIG. 1A, the light source device 10 is, for example, a ceramic substrate, and includes the light emitting device 11 provided on a substrate 12 having a wiring circuit, and electronic components 18 provided on the substrate 12. The electronic components 18 are, for example, resistors R1 to R5 (hereinafter, collectively referred to as a resistor R), capacitors C1 and C2 (hereinafter, collectively referred to as a capacitor C), and a diode Di1 (hereinafter, collectively referred to as Di). These electronic components 18 do not necessarily have to be provided.

As illustrated in FIGS. 1B and 1C, the light emitting device 11 includes a circuit wiring 13 of the substrate 12. The circuit wiring 13 includes a circuit wiring 13A and a circuit wiring 13B, and has light emitting diodes (LED) 15 which are light emitting elements bonded by a metal bonding layer 14 such as AuSn (gold tin) and the like on the circuit wiring 13A. The upper surface of the LED 15 is a light emitting surface.

The LED 15 is electrically connected to the circuit wiring 13B by a bonding wire 17 such as Au (gold) and the like. In FIG. 1C, the bonding wire 17 provided at the back of the A-A cross section is schematically illustrated for the sake of easy understanding in the drawing and the description. Further, one of the circuit wirings 13A and 13B is an anode and the other is a cathode, and in the following cases, when not particularly distinguished, the circuit wirings 13A and 13B will be referred to as the circuit wiring 13.

The light emitting device 11 includes a frame (resin dam) 12 vertically provided on the substrate 21 so as to be inclined inward. The frame 21 is disposed to surround the LED 15 inside.

The frame 21 has an annular shape on the bottom surface of the substrate 12 and is rotationally symmetric with respect to a central axis CX which passes through a center O of the annular shape and is perpendicular (z direction) to the substrate 12. In addition, the frame 21 has a top portion having a rounded upper edge.

In the present embodiment, the light emitting device 11 is provided with four LEDs 15. The light emitting device 11 may be provided with at least one LED 15. In a case where a plurality of LEDs 15 are provided, the plurality of LEDs 15 are preferably disposed at a center of the light emitting device 11 (point O in FIG. 1B) on the substrate 12, that is, at positions rotationally symmetrical with respect to the central axis CX of the frame 21. In addition, the plurality of LEDs 15 disposed at rotationally symmetrical positions preferably have the same light distribution characteristics.

The sealing portion 23 made of a sealing resin is formed on the frame 21. The LED 15 and the bonding wire 17 are sealed in the sealing portion 23. The sealing portion 23 includes the first resin portion 23A and the second resin portion 23B, and the sealing portion 23 functions as a lens which is an optical element.

Figure 2A:
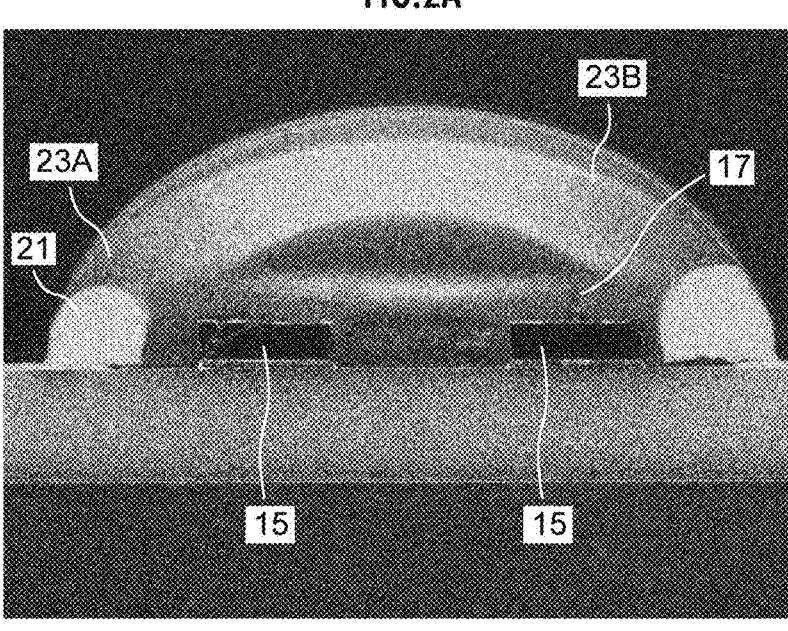
FIG. 2A is an optical microscope image when a cross section of the light emitting device 11 is observed.

FIG. 2A is an optical microscope image when the cross section of the light emitting device 11 is observed according to FIG. 1C. Further, FIG. 2B is a view in which the boundary between the first resin portion 23A and the second resin portion 23B is illustrated by a broken line in FIG. 2A.

Figure 2B:
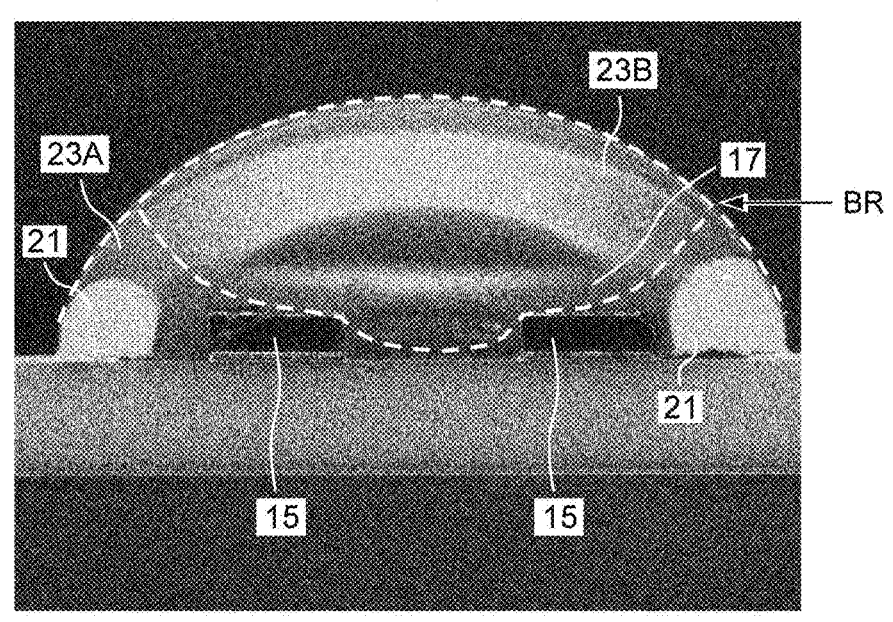
FIG. 2B is a view in which the boundary between a first resin portion 23A and a second resin portion 23B is illustrated by a broken line in FIG. 2A.

As illustrated in FIG. 2B, the first resin portion 23A is formed to cover at least a part of the top portion of the frame 21, the substrate 12, and a surface of the LED 15. The second resin portion 23B is formed to cover the entire upper surface of the first resin portion 23A. That is, the first resin portion 23A and the second resin portion 23B are formed in close contact with each other, and the inside of the frame 21 is filled with the sealing portion 23.

Further, as illustrated in FIG. 2B, a boundary line BR between the first resin portion 23A and the second resin portion 23B is above the top portion of the frame 21 and is inside the outer peripheral edge of the frame 21. As can be seen at the heights of the left and right frames 21 of FIG. 29, there is a difference in the heights of the frames 21, but the difference is compensated by the first resin portion 23A. Therefore, the boundary line BR is formed as a circle in which the height from the substrate 12 is the same in the plane perpendicular to the central axis CX.

The second resin portion 23B is formed on the first resin portion 23A to have the shape of a flat spherical body (or an oblate spheroid body). The external surfaces of the first resin portion 23A and the second resin portion 23B are continuous, and the first resin portion 23A and the second resin portion 23B have a common external surface of a flat spherical body. That is, the external surface of the sealing portion 23 including the first resin portion 23A and the second resin portion 23B is formed as one rotationally symmetrical flat spherical body surface, and the cross section of the surface including the central axis CX has an elliptical shape.

Figure 3:
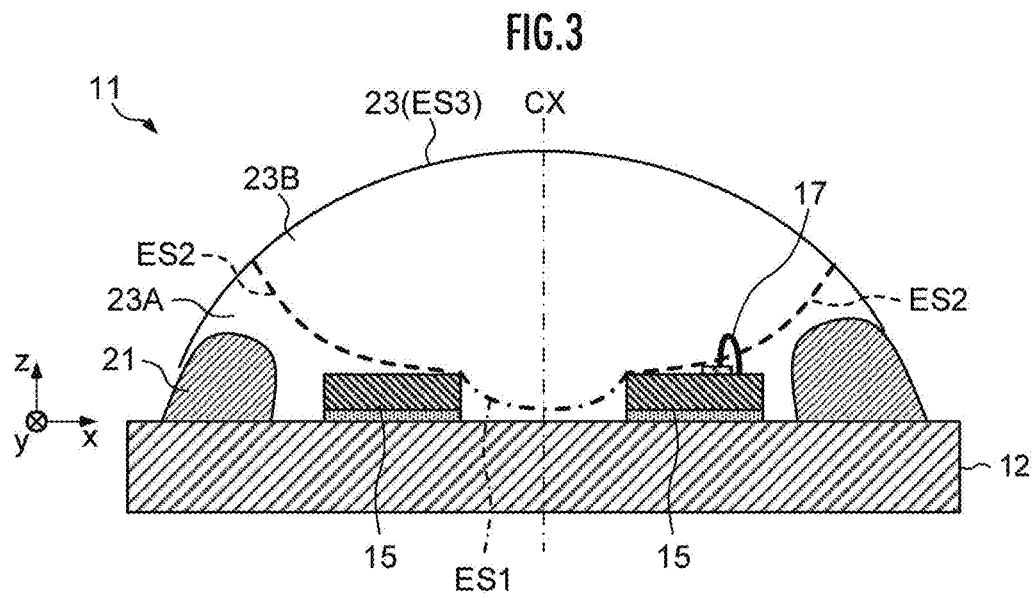
FIG. 3 is a schematic cross-sectional view for describing an interface between the first resin portion 23A and the second resin portion 23B, and a shape of the surface of a sealing portion 23.

FIG. 3 is a schematic cross-sectional view for describing an interface between the first resin portion 23A and the second resin portion 23B, and a surface of the sealing portion 23. In addition, FIG. 4 is an optical microscope image of the interface between the first resin portion 23A and the second resin portion 23B, in which a fitted ellipse (broken line) is inserted into the surface of the sealing portion 23.

As illustrated in FIG. 3, the first resin portion 23A and the second resin portion 23B have two concave interfaces, a first interface (the interface on the center side) between the LEDs 15 which face each other across the center O of the light emitting device 11 and a second interface from the upper surface of the LEDs 15 to the external surface of the sealing portion 23 (the outer peripheral interface).

Figure 4:
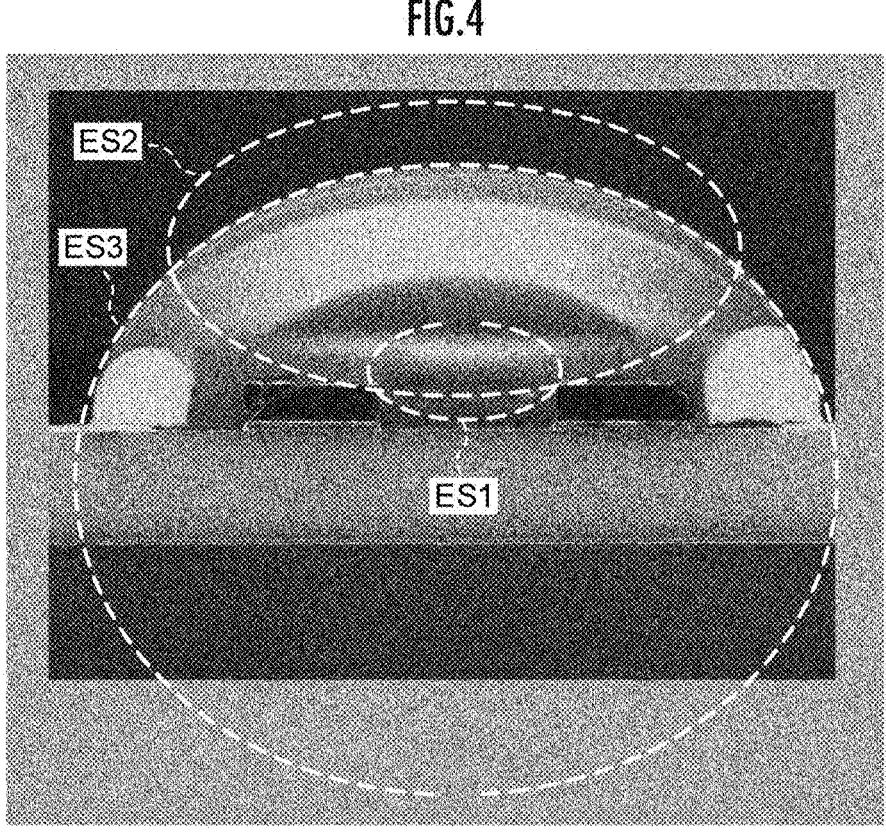
FIG. 4 is an optical microscope image of the interface between the first resin portion 23A and the second resin portion 23B, in which a fitted ellipse (broken line) is inserted into the surface of the sealing portion 23.

More specifically, as illustrated in FIG. 4 or with reference to FIGS. 2A and 2B, it is understood that the first interface between the LEDs 15 is fitted by the surface of a first flat spherical body ES1, and the second interface from the upper surface of the LEDs 15 to the external surface of the sealing portion 23 is fitted by the surface of a second flat spherical body ES2.

In addition, it is understood that the external surface of the sealing portion 23 is fitted by the surface of a third flat spherical body ES3.

More specifically, the surface of the first resin portion 23A (that is, the interface with the second resin portion 23B) is at least one flat spherical body surface coaxial with the central axis CX of the frame 21 and is a concave surface. That is, the flat spherical body is a rotational body (elliptical body) obtained by rotating the ellipse with the central axis CX as a rotational axis. In the case shown in FIGS. 3 and 4, the flat spherical body has the shape of a rotational body when the short axis of the ellipse is rotated as the rotational axis.

In addition, the concave surface of the first resin portion 23A is configured with at least one flat spherical body surface depending on the number and arrangement of the LEDs 15 (light emitting elements) placed inside the frame 21. On the other hand, the sealing portion 23 is formed as one flat spherical body, that is, the external surface thereof is one flat spherical body surface and is formed as a convex surface.

Therefore, as illustrated in FIGS. 3 and 4, the first to third flat spherical bodies ES1 to ES3 are flat spherical bodies coaxial with the central axis CX of the light emitting device 11 which is perpendicular to the substrate 12 (z direction).

Here, in a case where the surface of the first resin portion 23A or a part thereof can be regarded as a flat spherical body surface, the curvature of the concave surface of the first resin portion 23A preferably satisfies the following conditions.

That is, if the long axis radius of the cross section (ellipse) of a flat spherical body is a and the short axis radius is h, when a ratio (b/a) at a flatness ratio of the flat spherical body=1–(b/a) is defined as a curvature CV of the flat spherical body surface, curvatures CV1, CV2, and CV3 of the first to third flat spherical bodies ES1, ES2, and ES3 are preferably as follows:

$$CV1 < CV3, CV2 < CV3 \qquad \text{Equation (1)}$$

In other words, the curvature of the third flat spherical body ES3 is larger than the curvature of the flat spherical body surface on the concave surface of the first resin portion 23A. That is, the degree of bending (radius of curvature) of the third flat spherical body surface is the largest.

Although the case where the surface (interface) of the first resin portion 23A has at least one flat spherical body surface has been described, the present invention is not limited thereto. The surface of the first resin portion 23A may be formed as a concave surface having at least one rotational plane with the central axis CX as a rotational axis.

Therefore, in general, when the surface of the first resin portion 23A has the at least one rotational plane, the curvature of the external surface of the second resin portion 23B is preferably larger than that of at least one of the rotational planes on the concave surface of the first resin portion 23A.

As described above, since the first resin portion 23A and the second resin portion 23B are rotationally symmetrical with respect to the central axis CX, respectively, the sealing portion 23 including the first resin portion 23A and the second resin portion 23B is formed as an optical element (lens) rotationally symmetric with respect to the central axis CX of the light emitting device 11. Therefore, a high-precision optical element (lens) is formed with no deviation of the optical axis or an extremely slight deviation even if there is a deviation. In addition, the spherical surface precision for an optical element such as a lens is extremely high.

As illustrated in FIGS. 2A, 2B, 3, and the like, the bonding wire 17 that connects the circuit wiring 13 and the LED 15 is not completely embedded by the first resin portion 23A. That is, the bonding wire 17 is embedded so as to reach the inside of the second resin portion 23B. However, the entire bonding wire 17 may be configured to be embedded by the first resin portion 23A.

(Number and Arrangement of Light Emitting Elements (LED) 15)

When one light emitting element (LED) 15 is provided, the central axis of the LED 15 is preferably disposed so as to be common to the central axis CX of the light emitting device 11.

In addition, when a plurality of the LEDs 15 are provided, the plurality of the LEDs 15 are preferably disposed at positions rotationally symmetrical with respect to the central axis CX of the light emitting device 11.

(Shapes of Frame 21 and Sealing Portion 23)

In the above-described embodiment, the case where the frame 21 is an annular body whose bottom surface, which is the contact surface with the substrate 12, is annular, and the sealing portion 23 is a flat spherical body, has been described, but the present invention is not limited thereto.

For example, the frame 21 may be an annular body whose bottom surface is an elliptical ring. In this case, the sealing portion 23 has an elliptical body shape having a long axis, a short axis, and the central axis CX as a diameter of the frame 21. In addition, the first interface and the second interface of the first resin portion 23A and the second resin portion 23B are elliptical body surfaces coaxial with the central axis CX. Therefore, a light emitting device including a high-precision optical element (lens) with no deviation of the optical axis is formed. In addition, in the present specification, the term of an elliptical ring includes an oval-annular ring including an oval shape.

(Material of Frame 21, First Resin Portion 23A, and Second Resin Portion 23B)

The frame 21 is formed of, for example, a silicone resin and is formed as a reflective white resin containing titanium oxide particles and the like. A resin having high compatibility with the resin of the first resin portion 23A, having a higher viscosity than that of the first resin portion 23A and having a viscosity capable of forming a frame, is used.

As the resin (first resin) of the first resin portion 23A, for example, a silicone resin is used. As the first resin, a low-viscosity cohesive resin with fluidity is used. For example, a resin having a viscosity of about 1 to 2 Pa·s is used. In addition, a resin having a high chemical compatibility with the resin of the frame 21 and the second resin portion 23B is used. Since a resin having a low viscosity is used as the first resin, there is an advantage that air bubbles are not caught. In addition, the frame 21 and the second resin portion 23B can be formed in a complementary shape.

As the resin (second resin) of the second resin portion 23B, for example, a silicone resin is used. That is, as the second resin, a resin having higher viscosity or higher cohesiveness than the first resin is used. For example, a resin having a viscosity of about 17 to 26 Pa·s is used. For example, a nano-Silica filler is added to form a highly cohesive structure of a three-dimensional network structure.

The same type of resin, for example, a silicone resin, is preferably used for the first resin portion 23A and the second resin portion 23B. In particular, it is preferable to use resins having a small difference in thermal expansion coefficients or the same resin. That is, it is possible to form an optical element from which peeling is prevented. Further, resins having a small difference in refractive index or the same resin are preferably used. Thus, the directional characteristics of the light emitted from the LED 15 can be easily controlled by the light emitted from the light emitting device 11 through the sealing portion 23.

(Method for Manufacturing Light Emitting Device 11)

Figure 5:
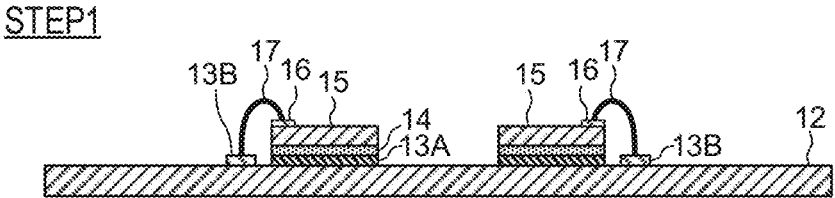
FIG. 5 is a schematic cross-sectional view illustrating a method for manufacturing the light emitting device 11.
Figure 5:
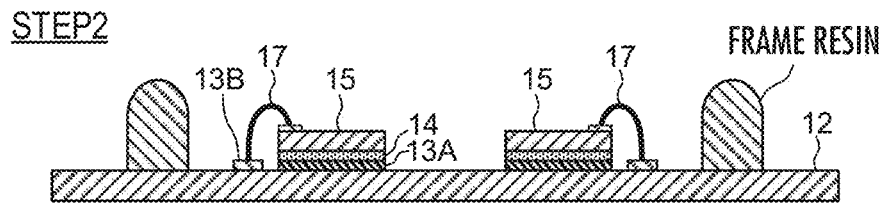
Figure 5:
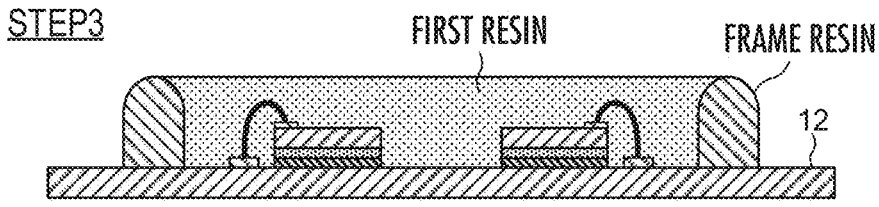
Figure 5:
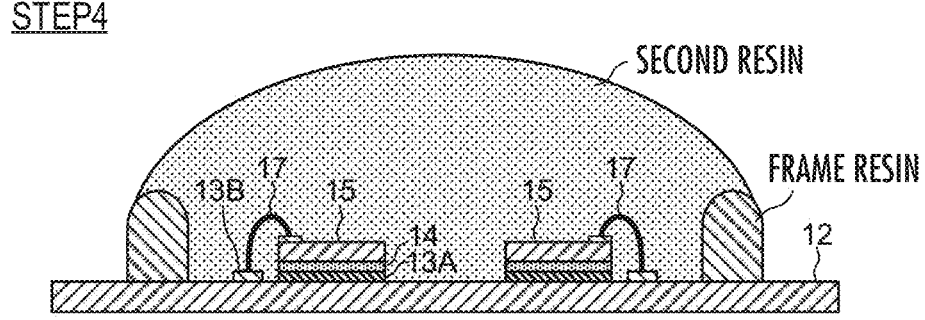
Figure 5:
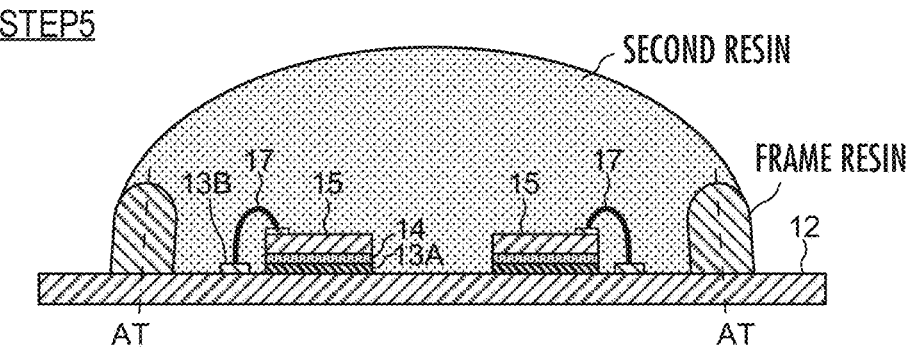

STEP 1: The method for manufacturing the light emitting device 11 will be described with reference to FIG. 5. First, the LED 15 is bonded on the circuit wiring 13A by an AuSn bonding layer 14. An electrode 16 of the LED 15 and the circuit wiring 13B are wire-bonded by an Au wire and connected.

STEP 2: A dam resin (frame resin) is applied in an annular shape to a predetermined thickness.

STEP 3: The first resin is injected so as to fill the inside of the dam (frame 21).

STEP 4: The second resin is injected into the first resin.

STEP 5: Subsequently, a curing treatment of the resin is performed. Heat treatment is performed in an electric furnace to cure the dam resin (frame resin), the first resin, and the second resin at the same time, and the sealing portion 23 including the frame 21, the first resin portion 23A, and the second resin portion 23B is formed. That is, in STEPs 2 and 3, only the resin is injected and is not cured. The light: emitting device 11 is manufactured by the above process.

The curing treatment of STEP 5 is preferably executed so that the frame resin is cured to form the frame 21 which is inclined inward (inclined axis AT) with respect to the central axis CX. Alternatively, in STEP 2, the applied frame resin may be subjected to a heat treatment to be cured. In this case, it is preferable to perform the heat treatment so that the frame resin is cured while being inclined inward. In this manner, the frame resin has a shape that is inclined inward so that it is possible to prevent light reflected on the inner side surface of the frame 21 to be emitted as stray light from the light emitting device 11.

(Mechanism)

Figure 6:
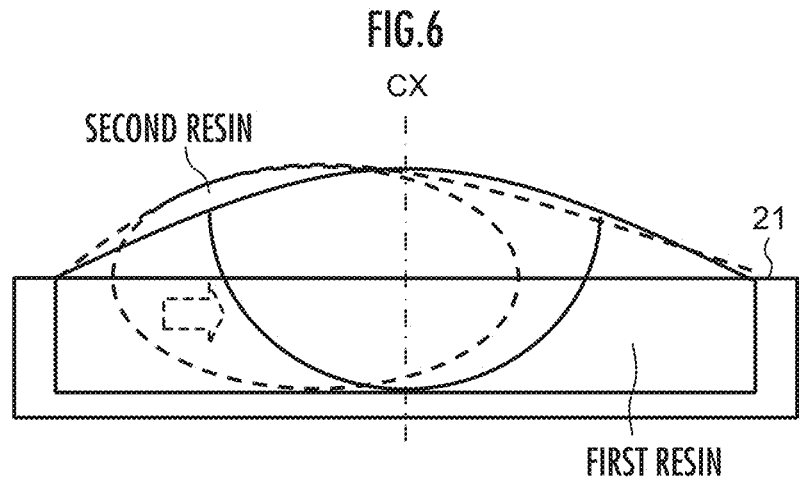
FIG. 6 is a schematic view for describing a mechanism in which a second resin injected into first resin becomes a flat spherical body.

Next, with reference to FIG. 6, a mechanism in which the second resin injected into the first resin becomes a flat spherical body will be described. FIG. 6 schematically illustrates a change in the state of the first resin and the second resin injected into the frame 21.

The second resin has higher viscosity or higher cohesiveness than the first resin. The second resin injected into the first resin moves in the first resin while being deformed (arrow in the drawing) and is stabilized in a central portion by self-alignment (solid line in the drawing). In addition, at this time, the entire surfaces of the second resin and the first resin have flat spherical body surfaces so that the internal energy is minimized. In addition, the surfaces of the first resin and the second resin are integrated to form a common flat spherical body surface.

Therefore, the positional deviation and the optical axis deviation between the light emitting element and the optical element are suppressed. In addition, the spherical surface precision of the obtained optical element is also high. Therefore, a light emitting device having a high-precision light distribution characteristic can be obtained.

Modification Example of First Embodiment

In the light emitting device 11 of the first embodiment described above, a phosphor may be added to the first resin portion 23A. For example, in a case where the LED 15 is a blue LED, a yellow phosphor, an amber phosphor, or the like may be added.

Alternatively, a phosphor may be added to the second resin portion 23B. Alternatively, a phosphor may be added to both the first resin portion 23A and the second resin portion 23B.

According to the present modification example, a Eight emitting device having suppressed color unevenness in addition to obtaining high-precision light distribution characteristics in which positional deviation and optical axis deviation are suppressed is realized.

Second Embodiment

Figure 7:
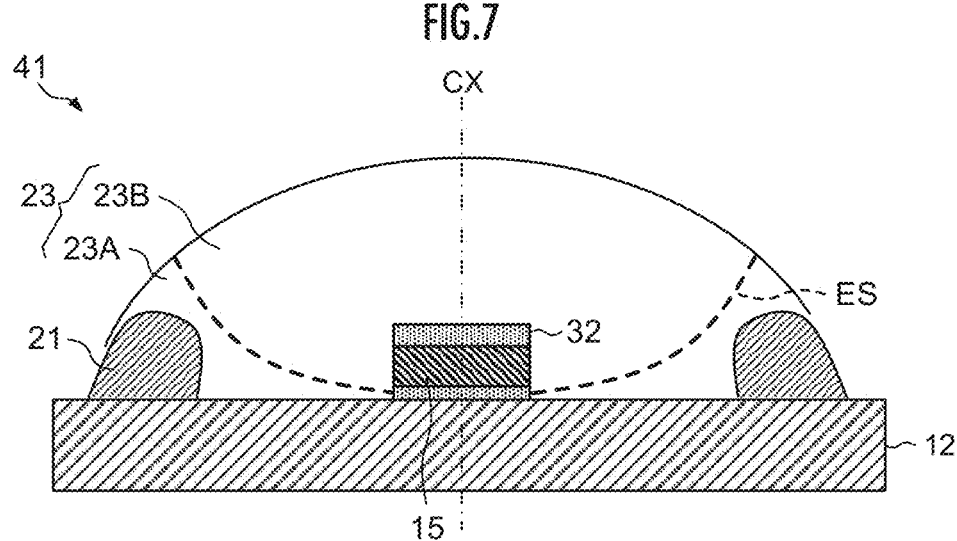
FIG. 7 is a cross-sectional view schematically illustrating a cross section of a light emitting device 41 according to a second embodiment in a surface including a central axis.

FIG. 7 is a cross-sectional view schematically illustrating a cross section of the tight emitting device 41 of a second embodiment in a surface including a central axis.

The point is the same as the light emitting device 11 of the first embodiment described above in that the sealing portion 23 of the light emitting device 41 includes the first resin portion 23A and the second resin portion 23B. The interface between the first resin portion 23A and the second resin portion 23B is the surface of a concave flat spherical body ES.

In the second embodiment, one LED 15 is disposed at the center O of the light emitting device 41. In addition, a phosphor plate 32 is placed on the upper surface (that is, a light emitting surface) of the LED 15.

As described above, also in the present embodiment, high-precision light distribution characteristics can be obtained, in which the positional deviation and the optical axis deviation are suppressed. In addition, even in a case where a phosphor is used, a light emitting device is realized in which color unevenness is suppressed.

Third Embodiment

Figure 8:
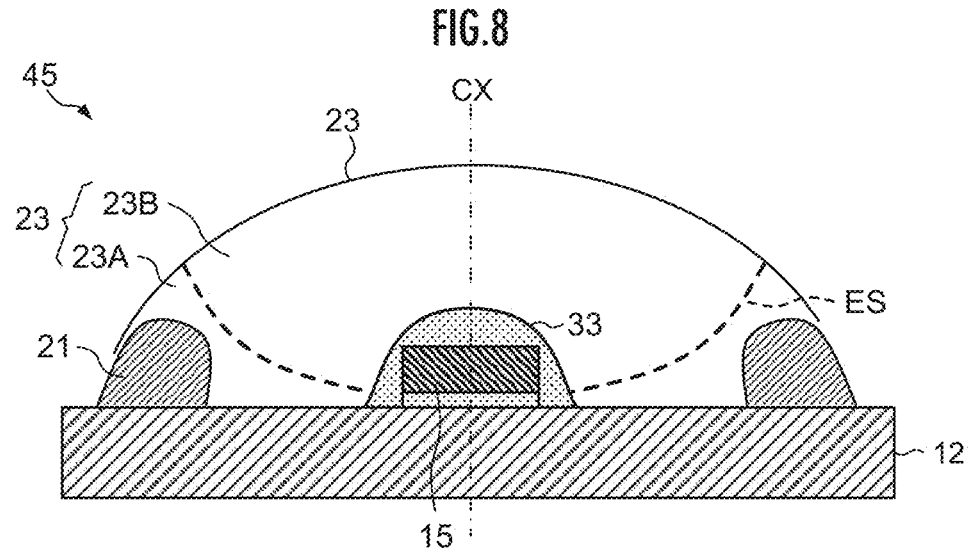
FIG. 8 is a cross-sectional view schematically illustrating a cross section of a light emitting device 45 according to a third embodiment in a surface including a central axis.

FIG. 8 is a cross-sectional view schematically illustrating a cross section of the light emitting device 45 of a third embodiment in a surface including a central axis.

In the third embodiment, one LED 15 is disposed at the center O of the light emitting device 41. In addition, a phosphor-containing layer 33 is formed so as to embed the LED 15. The phosphor-containing layer 33 contains phosphor particles in the resin.

Also in the present embodiment, high-precision light distribution characteristics in which the positional deviation and the optical axis deviation are suppressed can be Obtained. In addition, even in a case where a phosphor is used, a light emitting device is realized in which color unevenness is suppressed.

In the second embodiment and the third embodiment described above, the first resin portion 23A can also be a light-reflective resin. In addition, in the first embodiment described above, a phosphor plate can be disposed on the upper surface of each LED 15, and the LED 15 can be embedded in a phosphor-containing layer.

Fourth Embodiment

Figure 9A:
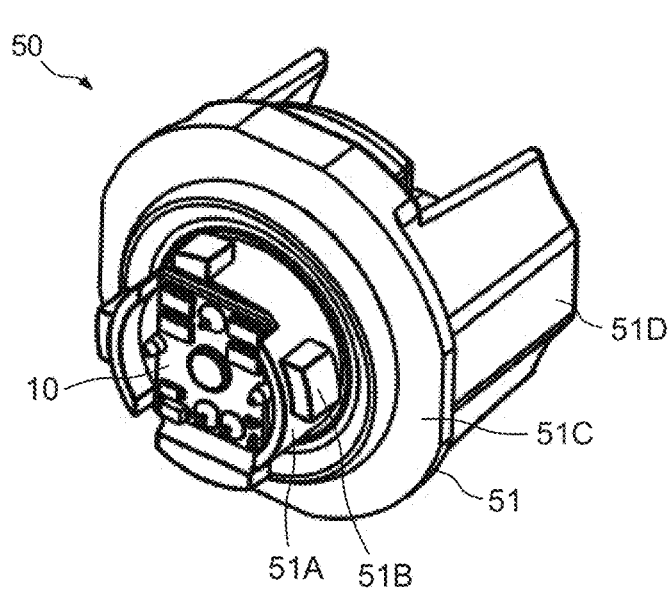
FIG. 9A is a perspective view illustrating a lamp 50 according to a fourth embodiment.
Figure 9B:
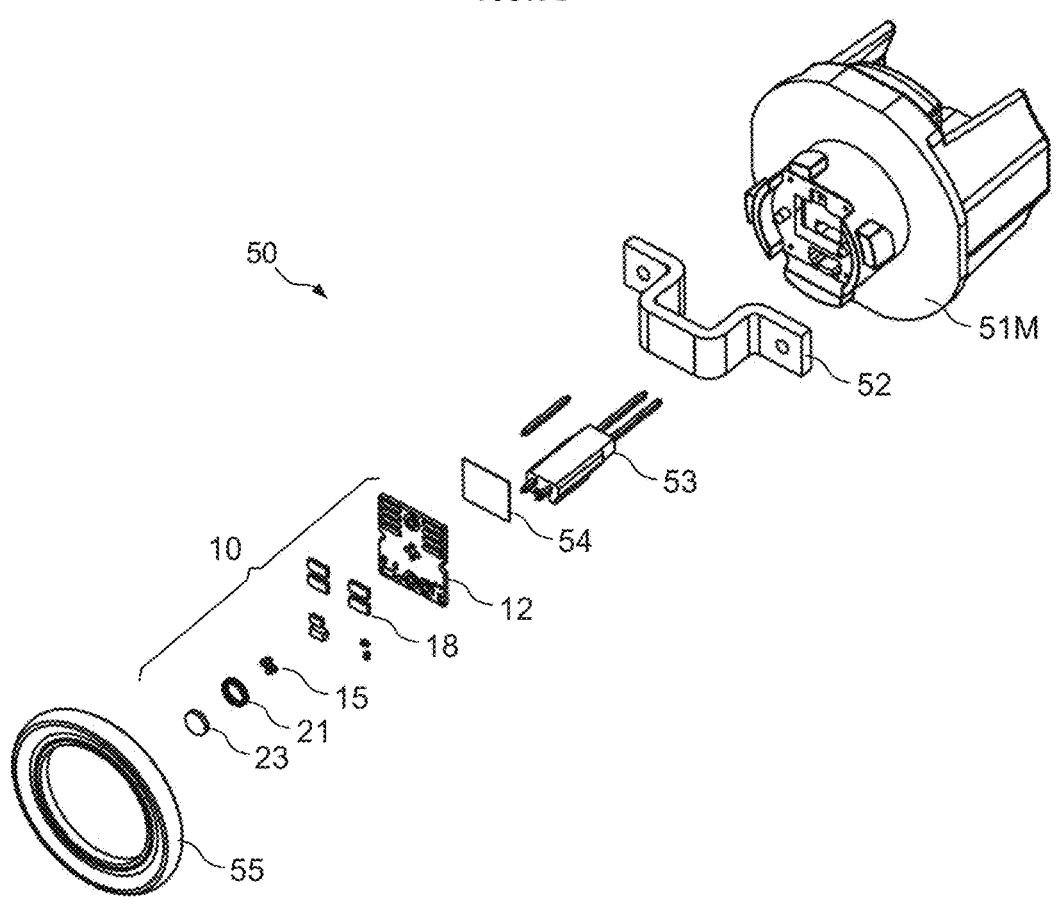
FIG. 9B is an exploded view of the lamp 50.

FIG. 9A is a perspective view illustrating the lamp 50 according to a fourth embodiment. Further, FIG. 9B is an exploded view of the lamp 50. The lamp 50 is, for example, a lamp for a vehicle.

As illustrated in FIG. 9A, the lamp 50 is configured by mounting the light source device 10 on an LED socket (hereinafter, simply referred to as a socket) 51. More specifically, the socket 51 includes a light source mounting portion 51A, a mounting portion 51B which is made up of a bayonet for mounting the lamp 50 on a vehicle or the like, a flange 51C, and heat radiation fins 51D.

A configuration of the lamp 50 will be described below with reference to FIG. 9B. The socket 51 of the lamp 50 is configured by integrally molding (insert molding) a socket main body portion 51M, a heat sink 52, and a terminal base 53. The terminal base 53 is electrically connected to the light source device 10.

The light source device 10 is mounted on the heat sink 52 via a heat conductive grease 54. A cover or the like is attached to the socket 51 via an O-ring 55.

The lamp 50 of the present embodiment has high-precision light distribution characteristics in which an optical axis deviation is suppressed. Further, according to the present embodiment, there is provided a lamp with high precision and a long life.

As described above, there are provided a light emitting device, a light source device, and a lamp that have a high-precision light distribution characteristic, in which a positional deviation and an optical axis deviation between a light emitting element and an optical element are suppressed, as described in detail. Further, there are provided a light emitting device, a light source device, and a lamp that have high adhesiveness between a sealing portion and a lens and have high precision and a long life even with respect to a temperature change.

DESCRIPTION OF REFERENCE NUMERALS

10: light source device
11, 41, 45: light emitting device
12: substrate
13: circuit wiring
14: bonding layer
15: light emitting element
17: bonding wire
18: electronic component
21: frame
23: sealing portion
23A: first resin portion
23B: second resin portion
50: lamp
51: socket
CX: central axis
ES1 to ES3: first to third flat spherical body

The invention claimed is:

1. A light emitting device comprising:
a substrate configured to have a circuit wiring;
semiconductor light emitting elements configured to be mounted on the substrate;
a frame configured to be vertically provided on the substrate in an annular or oval-annular shape so as to surround the semiconductor light emitting elements; and
a sealing portion configured to seal an inner wall of the frame, an upper surface of the substrate inside the frame, and the semiconductor light emitting elements, wherein the sealing portion includes:
   a first resin portion configured to have a concave surface having at least one rotational plane having a central axis of the frame as a rotational axis, and
   a second resin portion configured to cover the concave surface of the first resin portion and having a convex external surface, wherein the sealing portion has an external surface in which an external surface of the first resin portion and an external surface of the second resin portion are integrated,
wherein a boundary line between the external surface of the first resin portion and the external surface of the second resin portion is above a top portion of the frame, and
wherein a curvature of the external surface of the second resin portion is larger than a curvature of the concave surface of the first resin portion.

2. The light emitting device according to claim 1, wherein the concave surface has at least one flat spherical body surface or elliptical body surface coaxial with the central axis of the frame.

3. The light emitting device according to claim 1, wherein the external surface of the sealing portion has a common flat spherical body surface or elliptical body surface in an integrated manner with the external surface of the first resin portion and the external surface of the second resin portion.

4. The light emitting device according to claim 1, wherein the frame is vertically provided so as to be inclined inward.

5. The light emitting device according to claim 1, wherein the first resin portion is formed to cover a top portion of the frame, and the boundary line between the first resin portion and the second resin portion on the external surface of the sealing portion is above the top portion of the frame and inside an outer peripheral edge of the frame.

6. The light emitting device according to claim 1, wherein the first resin portion and the second resin portion are formed of the same type of resin, and a resin in the second resin portion has a higher viscosity than a resin in the first resin portion.

7. The light emitting device according to claim 1, wherein a nano-silica filler is added to the second resin portion.

8. A light emitting device comprising:
a substrate configured to have a circuit wiring;
semiconductor light emitting elements configured to be mounted on the substrate;
a frame configured to be vertically provided on the substrate in an annular or oval-annular shape so as to surround the semiconductor light emitting elements; and
a sealing portion configured to seal an inner wall of the frame, an upper surface of the substrate inside the frame, and the semiconductor light emitting elements, wherein the sealing portion includes:
   a first resin portion configured to have a concave surface having at least one rotational plane having a central axis of the frame as a rotational axis, and
   a second resin portion configured to cover the concave surface of the first resin portion and having a convex external surface,
wherein the sealing portion has an external surface in which an external surface of the first resin portion and an external surface of the second resin portion are integrated,
wherein a boundary line between the external surface of the first resin portion and the external surface of the second resin portion is above a top portion of the frame, and
wherein a plurality of the semiconductor light emitting elements are disposed at rotationally symmetrical positions with respect to the central axis of the frame on the substrate.

9. A light source device comprising:

a light emitting device comprising:

a substrate configured to have a circuit wiring;

semiconductor light emitting elements configured to be mounted on the substrate;

a frame configured to be vertically provided on the substrate in an annular or oval-annular shape so as to surround the semiconductor light emitting elements; and a sealing portion configured to seal an inner wall of the frame, an upper surface of the substrate inside the frame, and the semiconductor light emitting elements, wherein the sealing portion includes:

a first resin portion configured to have a concave surface having at least one rotational plane having a central axis of the frame as a rotational axis, and a second resin portion configured to cover the concave surface of the first resin portion and having a convex external surface, wherein the sealing portion has an external surface in which an external surface of the first resin portion and an external surface of the second resin portion are integrated, and wherein a boundary line between the external surface of the first resin portion and the external surface of the second resin portion is above a top portion of the frame, wherein the substrate includes a substrate circuit connected to the semiconductor light emitting elements outside the light emitting device, and electronic components placed on the substrate and mounted on the substrate circuit.

10. A lamp comprising:

the light source device according to claim 9; and a socket configured to include a terminal to which the light source device is attached, and which is electrically connected to the light source device.

\*   \*   \*   \*   \*